United States Patent
Nam

(10) Patent No.: US 7,612,819 B2
(45) Date of Patent: Nov. 3, 2009

(54) CMOS IMAGE SENSOR AND METHOD OF OPERATING THE SAME

(75) Inventor: Jung-Hyun Nam, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 596 days.

(21) Appl. No.: 11/264,236

(22) Filed: Nov. 1, 2005

(65) Prior Publication Data
US 2006/0097296 A1 May 11, 2006

(30) Foreign Application Priority Data
Nov. 5, 2004 (KR) .................. 10-2004-0089905

(51) Int. Cl.
H04N 5/335 (2006.01)
(52) U.S. Cl. .................. 348/308; 348/241; 348/243; 348/301; 257/297; 257/299
(58) Field of Classification Search ........... 348/243, 348/301, 302, 304, 308, 241; 257/258, 268, 257/291, 297, 299
See application file for complete search history.

(56) References Cited

U.S. PATENT DOCUMENTS

| | | | |
|---|---|---|---|
| 4,071,783 A * | 1/1978 | Knepper | 326/87 |
| 6,035,077 A | 3/2000 | Chen et al. | |
| 6,674,471 B1 * | 1/2004 | Masuyama | 348/312 |
| 6,690,000 B1 * | 2/2004 | Muramatsu et al. | 250/208.1 |
| 6,768,093 B2 * | 7/2004 | Miida | 250/208.1 |
| 6,784,934 B1 * | 8/2004 | Watanabe | 348/308 |
| 6,850,278 B1 * | 2/2005 | Sakurai et al. | 348/302 |
| 7,116,365 B1 * | 10/2006 | Ueno et al. | 348/308 |
| 7,259,790 B2 * | 8/2007 | Mabuchi et al. | 348/310 |
| 7,349,019 B2 * | 3/2008 | Yamaguchi et al. | 348/308 |
| 7,372,500 B2 * | 5/2008 | Watanabe et al. | 348/372 |
| 2002/0114025 A1 * | 8/2002 | Raynor et al. | 358/513 |
| 2003/0085402 A1 | 5/2003 | Tay | |
| 2005/0219876 A1 * | 10/2005 | Yan | 363/59 |

(Continued)

FOREIGN PATENT DOCUMENTS

JP 10248035 9/1998

(Continued)

OTHER PUBLICATIONS

English Abstract of JP10248035, Sep. 14, 1998.

(Continued)

Primary Examiner—Nhan T Tran
Assistant Examiner—Chriss S Yoder, III
(74) Attorney, Agent, or Firm—F. Chau & Assoc., LLC

(57) ABSTRACT

A complementary metal oxide semiconductor (CMOS) image sensor and a method for operating the same are provided. The CMOS image sensor includes a pixel array unit having a matrix of pixels, wherein each pixel comprises a charge transfer element for transferring charge collected in a photoelectric conversion element to a charge detection element, and a row drive unit for supplying a voltage to the charge transfer element during part of a charge integration period of the photoelectric conversion element, wherein the supplied voltage causes the charge transfer element to have a negative potential.

26 Claims, 10 Drawing Sheets

U.S. PATENT DOCUMENTS

2006/0060753 A1 * 3/2006 Rhodes .................. 250/208.1

FOREIGN PATENT DOCUMENTS

| KR | 20000005962 | 1/2000 |
| KR | 20010106829 | 12/2001 |
| KR | 20030009625 | 2/2003 |
| KR | 20040031626 | 4/2004 |
| TW | I220317 | 8/2003 |
| TW | 200304751 | 10/2003 |

OTHER PUBLICATIONS

English Abstract of 1020000005962 A, Jan. 5, 2000.
English Abstract of 1020030009625 A, Feb. 5, 2003.
English Abstract of 1020040031626 A, Apr. 13, 2004.
English Abstract for Publication No. 2001-0106829, date: Dec. 7, 2001.

* cited by examiner

CMOS IMAGE SENSOR AND METHOD OF OPERATING THE SAME

CROSS-REFERENCE TO RELATED APPLICATION

This application claims priority from Korean Patent Application No. 10-2004-0089905 filed on Nov. 5, 2004, in the Korean Intellectual Property Office, the disclosure of which is incorporated by reference herein in its entirety.

BACKGROUND OF THE INVENTION

1. Field of the Invention

The present invention relates to a Complementary Metal Oxide Semiconductor (CMOS) image sensor and a method of operating the same. More particularly, the present invention relates to a CMOS image sensor with improved dark current characteristics and a method of operating the same.

2. Description of the Related Art

Image sensors have been applied in various fields such as machine vision, robotics, satellite-based instrumentation, transportation, navigation, and guidance. Typically, image sensors have a two-dimensional array of pixels constituting an image frame.

Pixels include photoelectric conversion elements capable of accumulating charge corresponding to the amount of light absorbed. That is, when photons collide with surfaces of photoelectric conversion elements formed on a semiconductor substrate, free charge carriers are generated and collected in the photoelectric conversion elements. The collected carriers are read out and then transferred to an output circuit through various procedures, thereby reproducing images.

Representative image sensors are Charge Coupled Devices (CCDs) and Complementary Metal Oxide Semiconductor (CMOS) image sensors. The CCDs have a lower noise level and produce better image quality than the CMOS image sensors. However, the CMOS image sensors can be easily operated and adopt various scanning techniques. Furthermore, signal processing circuits can be integrated on a single chip, thus enabling miniaturization of products, and the compatibility with CMOS processing can reduce manufacturing costs. In addition, CMOS image sensors are very low in power consumption, and thus, can be easily adopted in products with limited battery capacity. Thus, CMOS image sensors are in widespread use.

The CMOS image sensors can be fabricated in various structures, but generally have a structure including four transistors and a photodiode, which is called a "4Tr structure" hereinafter. The 4Tr structure is manufactured using a common CMOS manufacturing process. However, the 4Tr structure generates a relatively large dark current.

A dark current is an output signal generated even when an object is not exposed to a pixel array unit. That is, the dark current is noise. It is generated regardless of whether there is an image to be recorded.

Excessively large dark current renders discrimination of brightness and darkness difficult, thereby decreasing a dynamic range. Further, a non-uniform and excessive dark current causes a "white defect", which generates a larger signal than normal. Therefore, the development of techniques to reduce the dark current is desirable.

SUMMARY OF THE INVENTION

The present invention provides a complementary metal oxide semiconductor (CMOS) image sensor which has improved dark current characteristics.

The present invention also provides a method of operating a CMOS image sensor which has improved dark current characteristics.

The above stated features of the present invention will become clear to those skilled in the art upon review of the following description.

According to an aspect of the present invention, there is provided a CMOS image sensor including: a pixel array unit having a matrix of pixels, wherein each pixel includes a charge transfer element for transferring charges collected in a photoelectric conversion element to a charge detection element; and a row drive unit for supplying a voltage to the charge transfer element during a part of a charge integration period of the photoelectric conversion element, wherein the supplied voltage causes the charge transfer element to have a negative potential to the charge transfer element.

According to another aspect of the present invention, there is provided a method of operating a CMOS image sensor, including supplying a voltage to the charge transfer element during a part of a charge integration period of an photoelectric conversion element, wherein the supplied voltage causes a charge transfer element to have a negative potential, and activating the charge transfer element and transferring charges collected in the photoelectric conversion element to a charge detection element.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS

Figure 1:
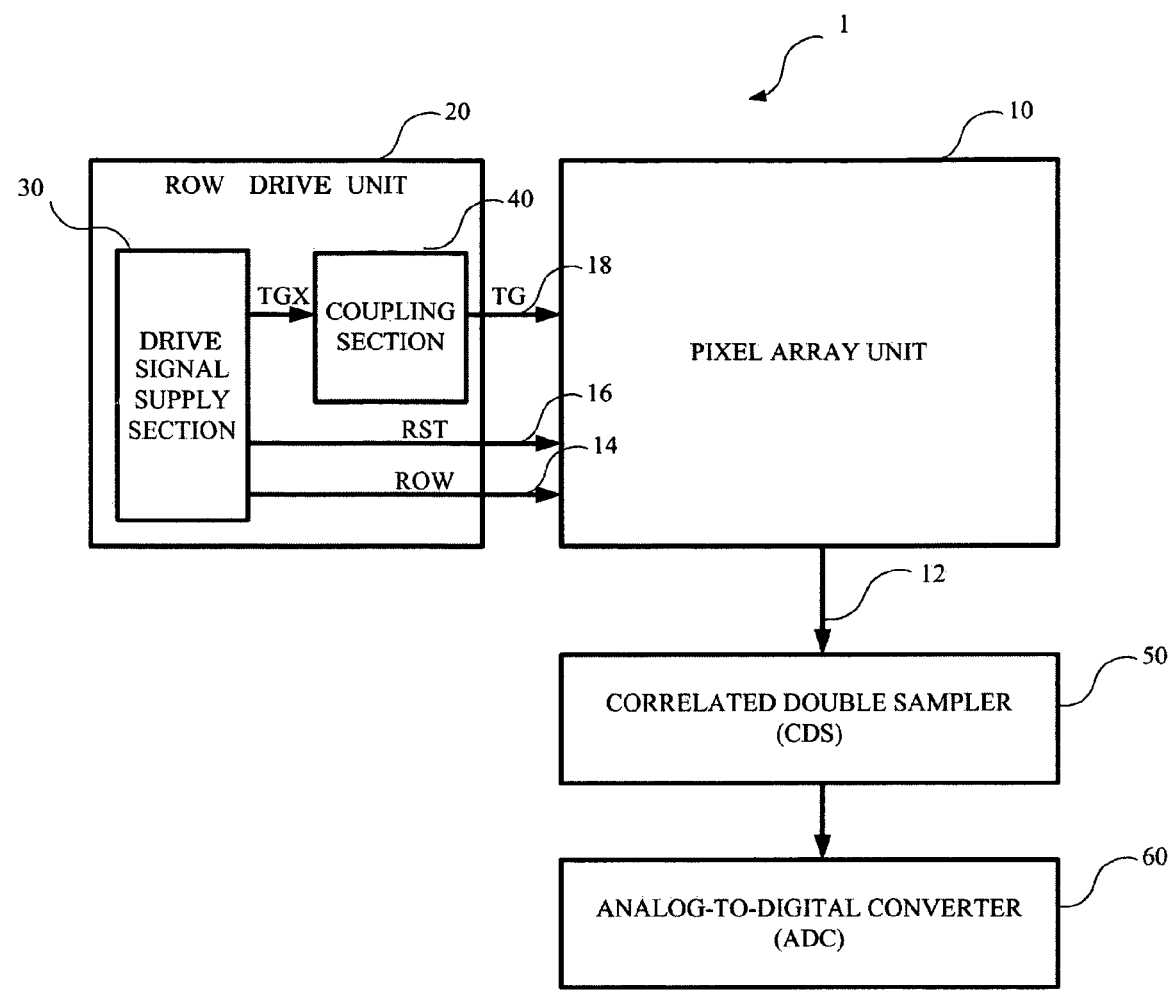
FIG. 1 is a block diagram illustrating a complementary metal oxide semiconductor (CMOS) image sensor according to an embodiment of the present invention.

Features of the present invention and methods of accomplishing the same may be understood more readily by reference to the following detailed description of the preferred embodiments and the accompanying drawings. The present invention may, however, be embodied in many different forms and should not be construed as being limited to the embodiments set forth herein. Rather, these embodiments are provided so this disclosure will be thorough and complete and will fully convey the concept of the invention to those skilled in the art, and the present invention will be defined by the appended claims. Like reference numerals refer to like elements throughout the specification.

FIG. 1 is a block diagram illustrating a Complementary Metal Oxide Semiconductor (CMOS) image sensor according to an embodiment of the present invention.

Referring to FIG. 1, a CMOS image sensor 1 includes a pixel array unit 10, a row drive unit 20, a Correlated Double Sampler (CDS) 50, and an Analog-to-Digital Converter (ADC) 60. The row drive unit 20 includes a drive signal supply section 30 and a coupling section 40.

The pixel array unit 10 includes a matrix of pixels. The plurality of pixels absorbs light reflected from an object and converts the absorbed light into an electrical signal. The pixel array unit 10 receives a plurality of drive signals including a pixel selection signal ROW, a reset signal RST, and a charge transfer signal TG, from the row drive unit 20. The electrical signal is supplied to the CDS 50 via a vertical signal line 12.

The row drive unit 20 receives a timing signal and a control signal from a controller (not shown) and supplies drive signals for a read-out operation on the plurality of pixels to the pixel array unit 10. With respect to the matrix of pixels, it is common to supply drive signals in a row-wise manner.

The row drive unit 20 includes the drive signal supply section 30 and the coupling section 40. The drive signal supply section 30 supplies the pixel selection signal ROW and the reset signal RST to the pixel array unit 10, and it supplies a charge transfer processing signal TGX to the coupling section 40, in a row-wise manner.

The pixel selection signal ROW is a signal for controlling selection elements in the pixel array unit 10. For example, the pixel selection signal ROW is supplied to selection elements of an i-th row via an i-th pixel selection signal line 14.

The reset signal RST is a signal for controlling reset elements in the pixel array unit 10. For example, the reset signal RST is supplied to reset elements of an i-th row via an i-th reset signal line 16.

The charge transfer processing signal TGX is supplied to the coupling section 40 and converted to the charge transfer signal TG for controlling charge transfer elements (see 130 of FIG. 2) in the pixel array unit 10.

The coupling section 40 receives the charge transfer processing signal TGX and supplies the charge transfer signal TG to the charge transfer elements in the pixel array unit 10. The charge transfer signal TG is generated by negative boosting of the charge transfer processing signal TGX, and includes a voltage that allows the charge transfer elements to have a negative potential. Preferably, the coupling section 40 directly supplies a logic "high" charge transfer processing signal TGX to the pixel array unit 10, whereas it negatively boosts a logic "low" charge transfer processing signal TGX. Of course, even when the charge transfer processing signal TGX is a logic "high," it may be negatively boosted. However, the charge transfer elements should not go below a threshold voltage.

The CDS 50 receives an electrical signal generated in the pixel array unit 10 via the vertical signal line 12, and holds and samples the received electrical signal. That is, the CDS 50 performs double sampling of a predetermined reference voltage level (hereinafter, referred to as a "noise level") and the voltage level of the electrical signal (hereinafter, referred to as a "signal level") and outputs the difference. The CDS 50 is responsible for suppressing the noise generated by the pixel array unit 10 and the vertical signal line 12. An amplifier (not shown) receives the aforementioned voltage difference from the CDS 50 and outputs an analog signal having an appropriate gain where the appropriate gain is achieved using programmable gain amplification.

The ADC 60 receives the analog signal from the amplifier and outputs a digital signal for offset correction. The digital signal is latched by a latch element (not shown), and a data selection element (not shown) supplies the latched signal to a multiplexer (not shown). The multiplexer serially arranges the received signals, and the serially arranged signals are supplied to an image signal processor (not shown).

Figure 2:
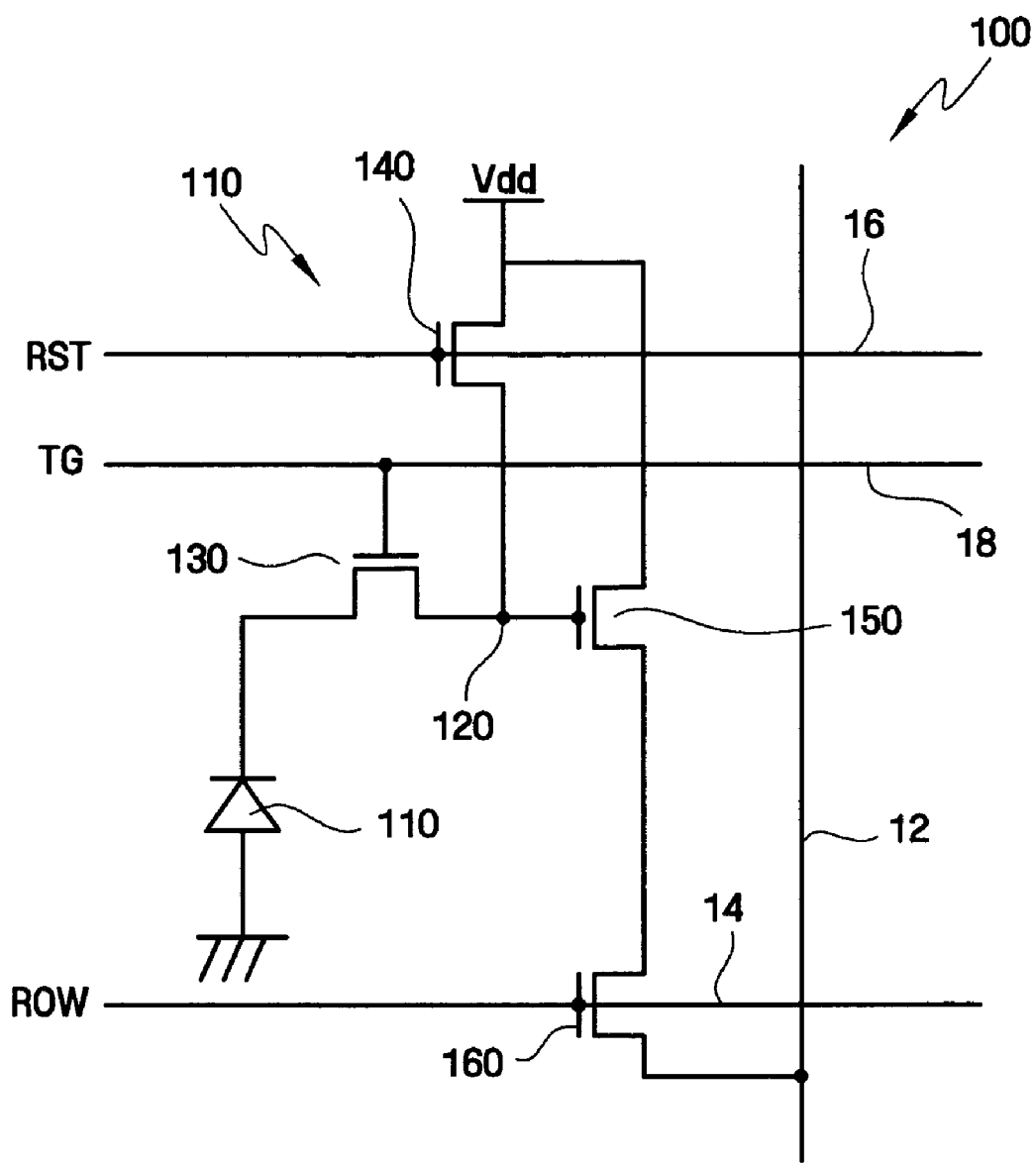
FIG. 2 shows a circuit view of a pixel of the CMOS image sensor of FIG. 1.
Figure 3:
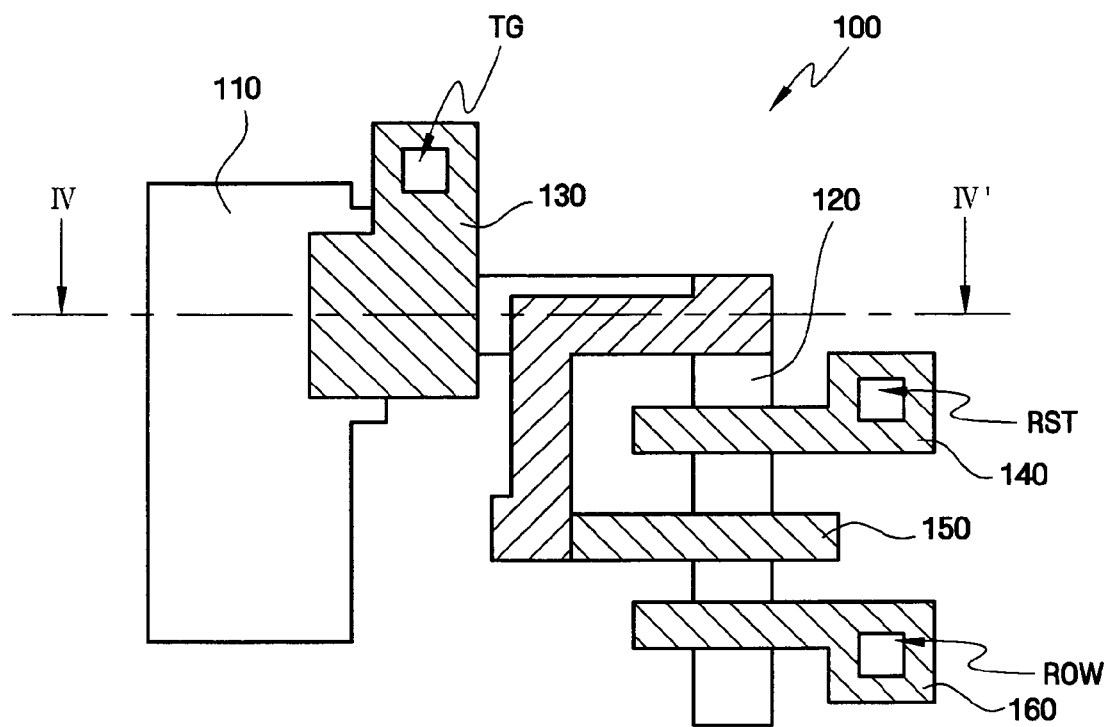
FIG. 3 is a schematic plan view of a pixel of the CMOS image sensor of FIG. 1.
Figure 4:
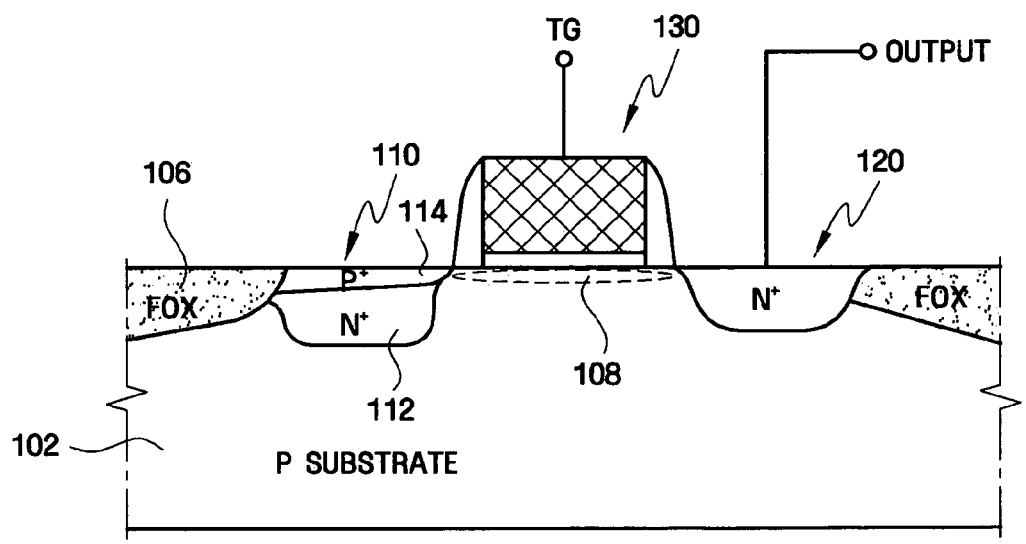
FIG. 4 shows a cross-sectional view taken along the IV-IV' line shown in FIG. 3.
Figure 5A:
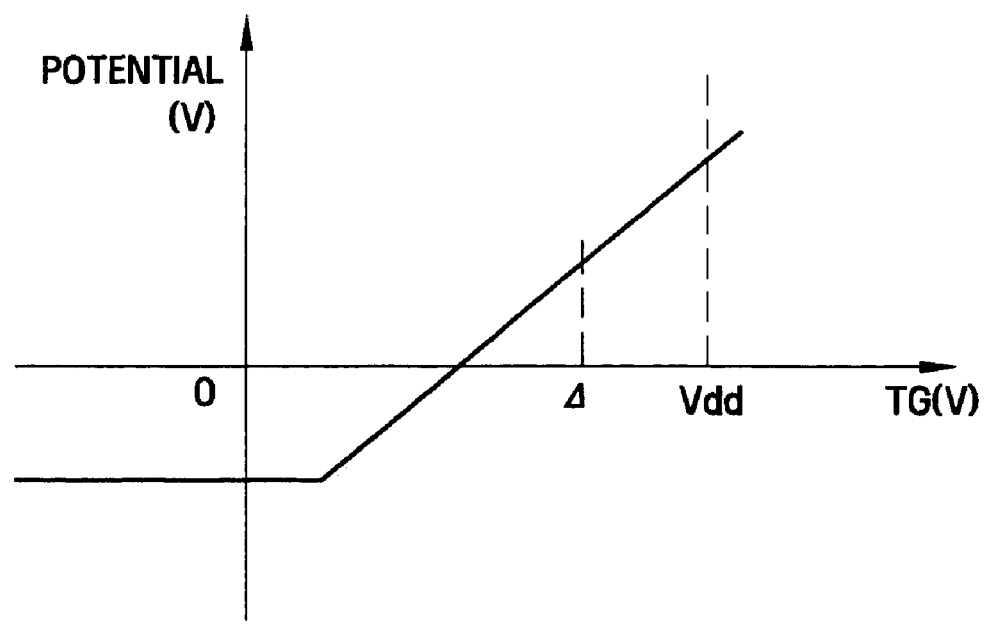
FIGS. 5A and 5B show views illustrating characteristics of a charge transfer element of the CMOS image sensor of FIG. 1.
Figure 5A:
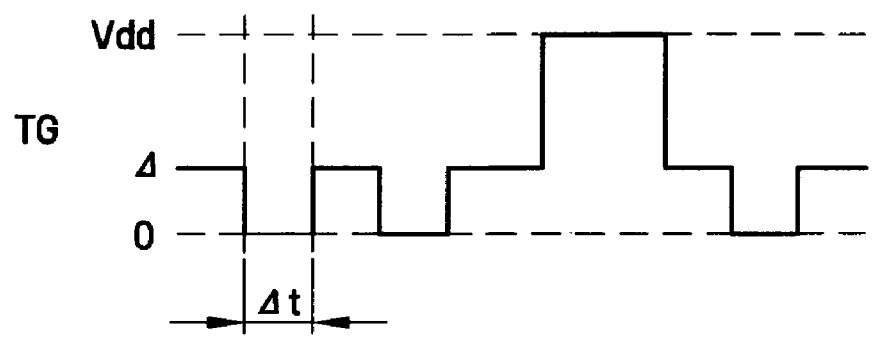
Figure 5B:
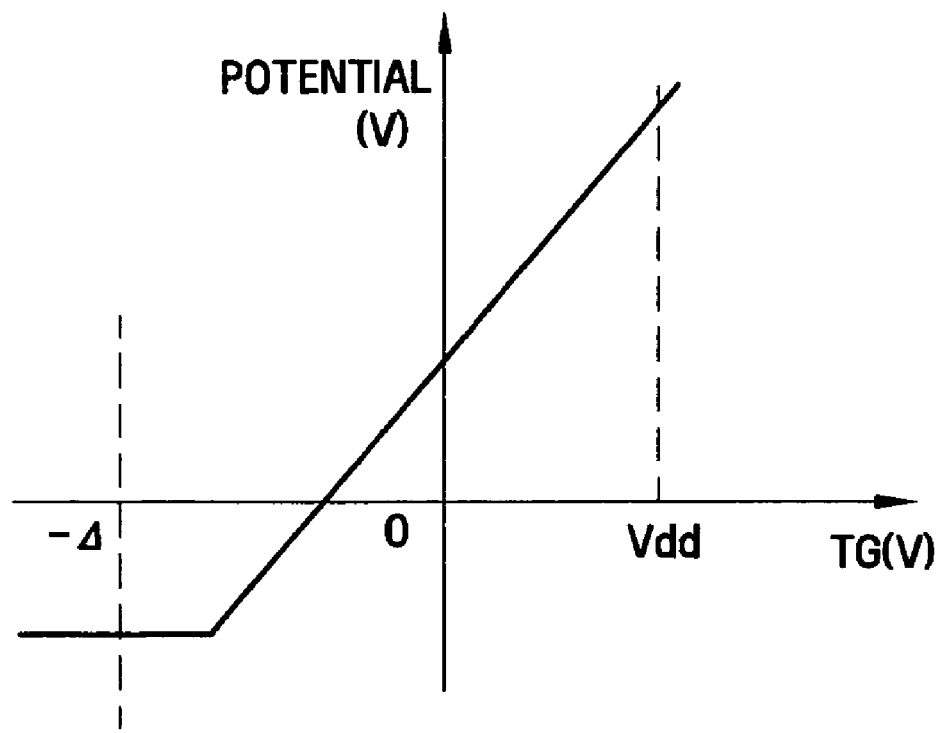
Figure 5B:
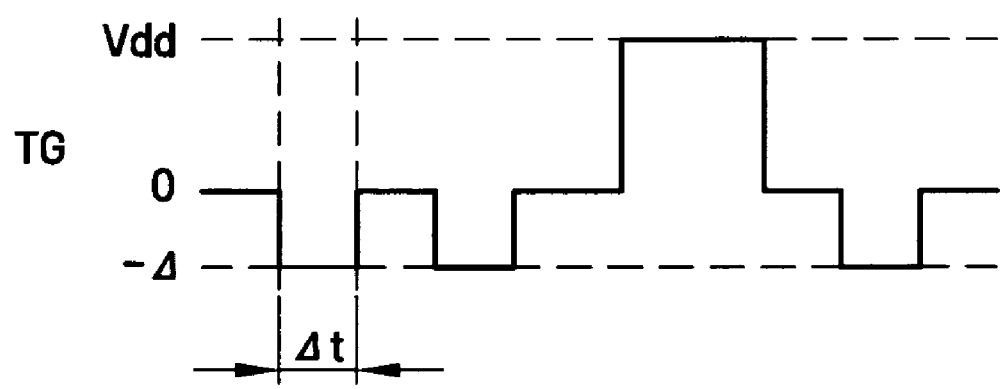

FIG. 2 shows a circuit view of a pixel of the CMOS image sensor of FIG. 1, and FIG. 3 is a schematic plan view of a pixel of the CMOS image sensor of FIG. 1. FIG. 4 shows a cross-sectional view taken along the IV-IV' line shown in FIG. 3. FIGS. 5A and 5B show views illustrating characteristics of a charge transfer element of the CMOS image sensor of FIG. 1.

First, referring to FIGS. 2 and 3, a pixel 100 of the CMOS image sensor includes a photoelectric conversion element 110, a charge detection element 120, a charge transfer element 130, a reset element 140, an amplification element 150, and a selection element 160.

The photoelectric conversion element 110 collects charge generated after absorbing light reflected from an object. The photoelectric conversion element 110 may be a photodiode, a phototransistor, a photogate, a Pinned Photo Diode (PPD), or a combination thereof.

A Floating Diffusion (FD) region can be used as the charge detection element 120. The charge detection element 120 receives charge collected in the photoelectric conversion element 110. Since the charge detection element 120 has a parasitic capacitance, charges are cumulatively collected. The charge detection element 120 is electrically connected to a gate of the amplification element 150 to control the amplification element 150.

The charge transfer element 130 transfers charges from the photoelectric conversion element 110 to the charge detection element 120. The charge transfer element 130 is generally composed of one transistor and is controlled by a charge transfer signal TG.

The reset element 140 periodically resets the charge detection element 120. A source of the reset element 140 is connected to the charge detection element 120 and a drain of the reset element 140 is connected to Vdd. The reset element 140 is driven in response to a reset signal RST.

The amplification element 150 serves as a source follower buffer amplifier in combination with a constant current generator (not shown) external to the pixel 100, and outputs a variable voltage to a vertical signal line 12 in response to the voltage of the charge detection element 120. A source of the amplification element 150 is connected to a drain of the selection element 160, and a drain of the amplification element 150 is connected to Vdd.

The selection element 160 selects a pixel to be read in a row-wise manner, and is driven in response to a pixel selection signal ROW. A source of the selection element 160 is connected to the vertical signal line 12.

Respective drive signal lines 18, 16, and 14 of the charge transfer element 130, the reset element 140, and the selection element 160 extend in a row direction (in a horizontal direction) so that pixels belonging to the same row are driven at the same time.

Referring to FIG. 4, a pixel of the CMOS image sensor includes a semiconductor substrate 102, a device isolation region 106, a photoelectric conversion element 110, a charge detection element 120, and a charge transfer element 130. For convenience of illustration, a PPD will be illustrated as the photoelectric conversion element 110.

The semiconductor substrate 102 is mainly a P-type substrate and includes active regions and device isolation regions. Although not shown, a P-type epitaxial layer may be grown on the semiconductor substrate 102 and/or a separate well region may be formed in the semiconductor substrate 102 to form the photoelectric conversion element 110, the charge transfer element 130, and other elements.

The device isolation region 106 defines the active regions of the semiconductor substrate 102. Typically, the device isolation region 106 may be a FOX (Field OXide) region or an STI (Shallow Trench Isolation) region, which is formed by a LOCOS (LOCal Oxidation of Silicon) process.

The photoelectric conversion element 110 collects charge generated after absorbing light, and it includes an $N^+$-type photodiode 112 and a $P^+$-pinning layer 114. Generally, the photodiode 112 and the pinning layer 114 are formed by two different ion implantation processes. First, the photodiode 112 is formed by ion implantation of an $N^+$ dopant to a deeper depth than peripheral source and drain regions. Second, the pinning layer 114 is formed on the photodiode 112 by ion implantation of a high dose of a low energy $P^+$ dopant. Of course, the doping concentration and position may vary according to the process design and thus the present invention is not limited to the above.

In a conventional CMOS image sensor, surface damage of a photodiode is a cause of dark current. The surface damage of the photodiode is mainly caused by dangling silicon bonds but may also be caused by defects associated with etching stress during formation of a gate or a spacer, for example. According to at least one embodiment of the present invention, the photodiode 112 is deeply formed in the semiconductor substrate 102, and the pinning layer 114 is formed on the photodiode 112. Therefore, dark current generation can be reduced and transfer of photo-generated charges can be greatly facilitated.

The charge detection element 120 is mainly formed by ion implantation of an $N^+$ dopant, and it receives the charge collected in the photoelectric conversion element 110 via the charge transfer element 130.

The charge transfer element 130 may be an enhancement type transistor with a low threshold voltage (Vth) or a depletion type transistor used to reduce overflow and a blooming phenomena that may occur in the photoelectric conversion element 110 when excessive light is emitted.

That is, in the case of using an enhancement type transistor with a low threshold voltage, even when a logic "low" signal is applied to a gate of the charge transfer element 130, a channel can be formed by a predetermined voltage above the threshold voltage. Therefore, charge generated (more than a predetermined amount) in the photoelectric conversion element 110 can flow into the charge detection element 120. Here, the channel can be formed by ion implantation of a $P^+$ dopant into a surface 108 of the semiconductor substrate 102 corresponding to the charge transfer element 130.

On the other hand, in the case of using a depletion type transistor, even when the charge transfer element 130 is in an inactive state, a channel is present. Therefore, charge generated (more than a predetermined amount) in the photoelectric conversion element 110 can flow into the charge detection element 120 via the charge transfer element 130, like in the above-described enhancement type transistor with a low threshold voltage. Here, the channel can be formed by ion implantation of an $N^-$ dopant in the surface 108.

However, use of the enhancement type transistor with a low threshold voltage and the depletion type transistor may cause an easier generation of dark current. Charge is generated by light but may also be generated by thermal energy. In particular, since dangling silicon bonds are present in the surface 108 of the semiconductor substrate 102 as described above, a plurality of midgap or trap levels are present between a valence band and a conduction band. Therefore, charge is easily generated even by low thermal energy through R-G center generation. For this reason, even when not exposed to light, charge can be generated in the charge transfer element 130. The generated charge can move via a channel still present even in an inactivated state of the charge transfer element 130, leading to dark current generation.

Injection of positive charge, i.e., holes, into the surface 108 of the semiconductor substrate 102 corresponding to the charge transfer element 130 can reduce dark current generation. Recombination of the holes with negative charges can transiently reduce charge generation. In this regard, if a voltage capable of injecting holes in the surface 108 of the semiconductor substrate 102, i.e., a voltage that allows the charge transfer element 130 to have a negative potential, is periodically supplied to the charge transfer element 130, a dark current effect can be reduced to a negligible level.

It is preferable that the voltage that allows the charge transfer element 130 to have a negative potential be periodically supplied to the charge transfer element 130. However, the voltage that allows the charge transfer element 130 to have a negative potential may also be transiently supplied to the charge transfer element 130 during part of a charge integration period of the photoelectric conversion element 110. Here, the phrase "charge integration period" indicates all periods except the period during which the charge transfer element 130, when activated, transfers charge to the charge detection element 120. To apply the voltage that allows the charge transfer element 130 to have a negative potential to the charge transfer element 130 throughout the charge integration period, a structural change of the conventional CMOS image sensor is required. In this regard, as described above with reference to FIG. 1, a row drive unit 20 of a CMOS image sensor according to an embodiment of the present invention performs negative boosting of a charge transfer processing signal and supplies a voltage that causes a charge transfer element to have a negative potential to the pixel array unit 10.

Hereinafter, the supplied voltage that causes a charge transfer element to have a negative potential will be described with reference to FIGS. 5A and 5B.

FIG. 5A illustrates a relation between a charge transfer signal TG applied to a gate of a charge transfer element and a potential of the charge transfer element when an enhancement type transistor with a low threshold voltage is used as the charge transfer element.

Even when the charge transfer signal TG is logic "low", the charge transfer element has a positive potential (a predetermined voltage A above the threshold voltage), which leads to the formation of a predetermined channel. A voltage that causes the charge transfer element to have a negative potential is applied to the charge transfer element during the charge integration period of a photoelectric conversion element. Preferably, this voltage is 0 V, and a holding period $\Delta t$ for this voltage is in the range of about 100 ns to 10 µs. This voltage is applied at least once during the charge integration period. However, since the logic "high" period of the charge transfer signal TG is constant, the number of applications of this voltage decreases with an increase in the holding period $\Delta t$.

FIG. 5B illustrates a relation between a charge transfer signal TG applied to a gate of a charge transfer element and a potential of the charge transfer element when a depletion type transistor is used as the charge transfer element.

When the charge transfer signal TG is logic "low", a channel is formed. When the charge transfer element is in an inactivated state, a voltage that causes the charge transfer element to have a negative potential is applied to the charge transfer element. Preferably, this voltage is negative (−Δ), and a holding time Δt for this voltage is in the range of about 100 ns to 10 μs. This voltage is applied at least once during the charge integration period. However, since the logic "high" period of the charge transfer signal TG is constant, the number of applications of this voltage decreases with an increase in the holding period Δt.

Figure 6:
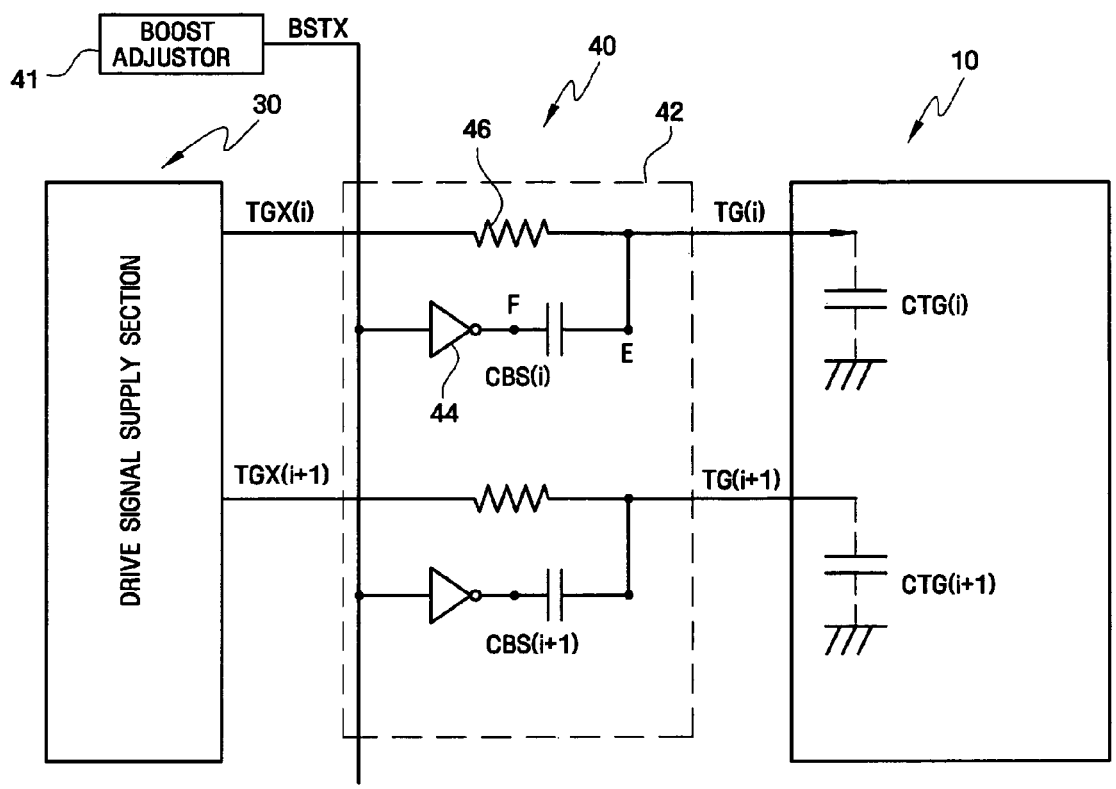
FIG. 6 shows a circuit view illustrating a coupling section of the CMOS image sensor of FIG. 1.
Figure 7:
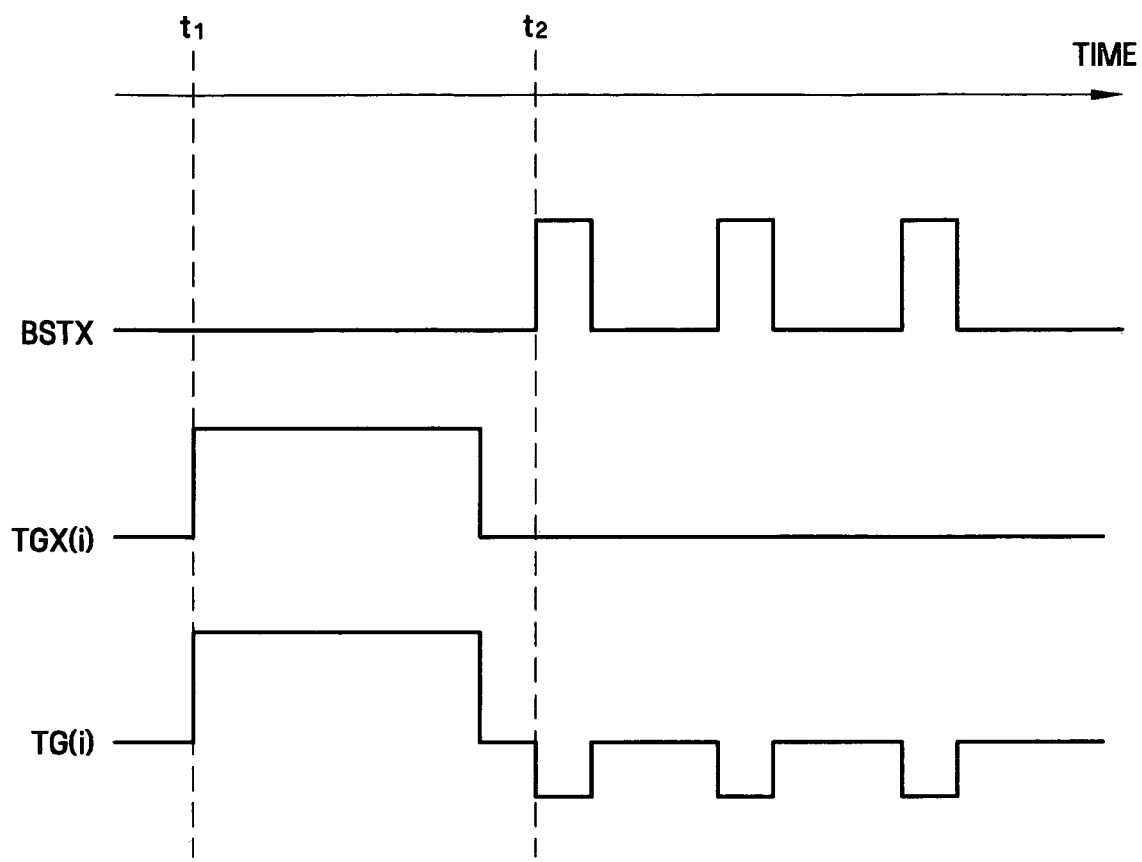
FIG. 7 is a timing diagram of the coupling section of FIG. 6.

FIG. 6 shows a circuit view illustrating a coupling section of the CMOS image sensor of FIG. 1, and FIG. 7 is a timing diagram of the coupling section of FIG. 6.

Referring to FIGS. 6 and 7, a boost control signal BSTX is a common signal for all pixels arranged in a row-wise manner in the pixel array unit 10. A charge transfer signal TG is a common signal for pixels belonging to each row of the pixel array unit 10. The pixel array unit 10 is composed of N rows. For convenience of illustration, a charge transfer processing signal TGX(i) and a charge transfer signal TG(i) of an i-th row will be illustrated.

Referring first to FIG. 6, a drive signal supply section 30 is managed by a controller (not shown), and supplies the charge transfer processing signal TGX(i) to a coupling section 40.

The coupling section 40 includes a boost adjustor 41 and a booster 42. The booster 42 includes a boost capacitor CBS(i), an inverter 44, and a resistor 46.

The boost adjustor 41 supplies the boost control signal BSTX to the booster 42. The boost control signal BSTX is maintained at a logic "low" when the charge transfer processing signal TGX(i) is logic "high", but the present invention is not limited thereto.

The coupling section 40 receives the boost control signal BSTX and performs negative boosting of the charge transfer processing signal TGX(i). That is, the coupling section 40 directly supplies the charge transfer processing signal TGX(i) to the pixel array unit 10 when the boost control signal BSTX is logic "low", whereas the coupling section 40 negatively boosts the charge transfer processing signal TGX(i) when the boost control signal BSTX is logic "high".

The boost capacitor CBS(i) is charged when the charge transfer processing signal TGX(i) is logic "high". On the other hand, when the charge transfer processing signal TGX(i) is logic "low", a node E is 0 V and a node F is Vdd. At this time, when the boost control signal BSTX transitions to logic "high", node F is converted to 0 V by the inverter 44. Node E is negatively boosted correspondingly to a predetermined voltage. Here, the negatively boosted voltage allows a charge transfer element 130 in a pixel 100 to have a negative potential.

When the charge transfer element that receives a charge transfer signal TG(i) is viewed from the outside, it appears that a loading capacitor CTG(i) with several pFs of capacitance is positioned on the charge transfer element. Thus, the boost capacitor CBS(i) and the loading capacitor CTG(i) perform charge coupling. Assuming that the voltage that allows a charge transfer element to have a negative potential is Vbs, the degree of negative boosting can be calculated by Equation 1:

$$Vbs = Vdd * \left\{ \frac{CBS(i)}{CBS(i) + CTG(i)} \right\}, \quad (1)$$

where Vbs and Vdd are absolute values.

For example, when the capacitance of the boost capacitor CBS(i) is nine times higher than that of the loading capacitor CTG(i), 90% of Vdd is subjected to negative boosting. Further, when the capacitance of the boost capacitor CBS(i) is 0.5 times higher than that of the loading capacitor CTG(i), about 33% of Vdd is subjected to negative boosting. It is preferable that the capacitance of the boost capacitor CBS(i) is higher because more holes are injected with an increase of the voltage Vbs, which causes the charge transfer element to have a negative potential. It is preferable to adjust the absolute value of Vbs to ⅒ of the absolute value of Vdd, but is not limited thereto.

The magnitude of the resistor 46 is adjusted according to a time constant (τ). As the time constant increases, charge and discharge of the boost capacitor CBS(i) are retarded. Therefore, the voltage Vbs can be maintained for a predetermined period. In this regard, it is preferable to sufficiently increase the magnitude of the resistor 46, but is not limited thereto.

FIG. 7 illustrates the operation of the coupling section 40 shown in FIG. 6. Referring to FIGS. 6 and 7, at time $t_1$, the boost control signal BSTX is logic "low" and the charge transfer processing signal TGX(i) transitions to logic "high". The charge transfer processing signal TGX(i) is transferred to the charge transfer element via the resistor 46, and the boost capacitor CBS(i) is charged.

At time $t_2$, the boost control signal BSTX transitions to logic "high", and the charge transfer processing signal TGX(i) is negatively boosted to supply a voltage to the charge transfer element, where the supplied voltage causes the charge transfer element to have a negative potential.

When the charge transfer processing signal TGX(i) is logic "high", it is preferable that the boost control signal BSTX is logic "low", but is not limited thereto. That is, when the charge transfer processing signal TGX is logic "high," it may be negatively boosted. However, it is preferred that the voltage of the charge transfer element not be reduced to less than a threshold voltage.

Figure 8:
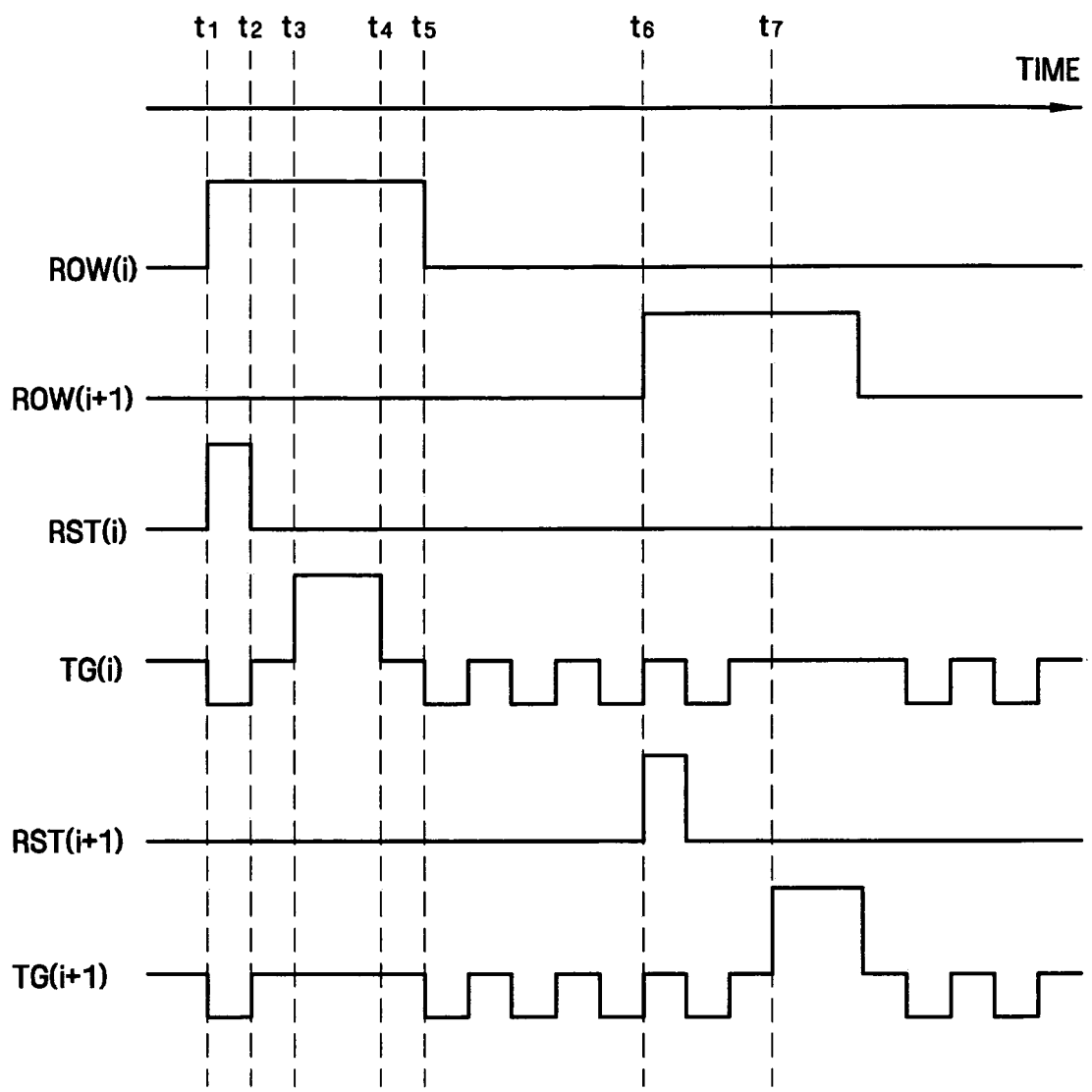
FIG. 8 is a timing diagram of the CMOS image sensor of FIG. 1.
Figure 9:
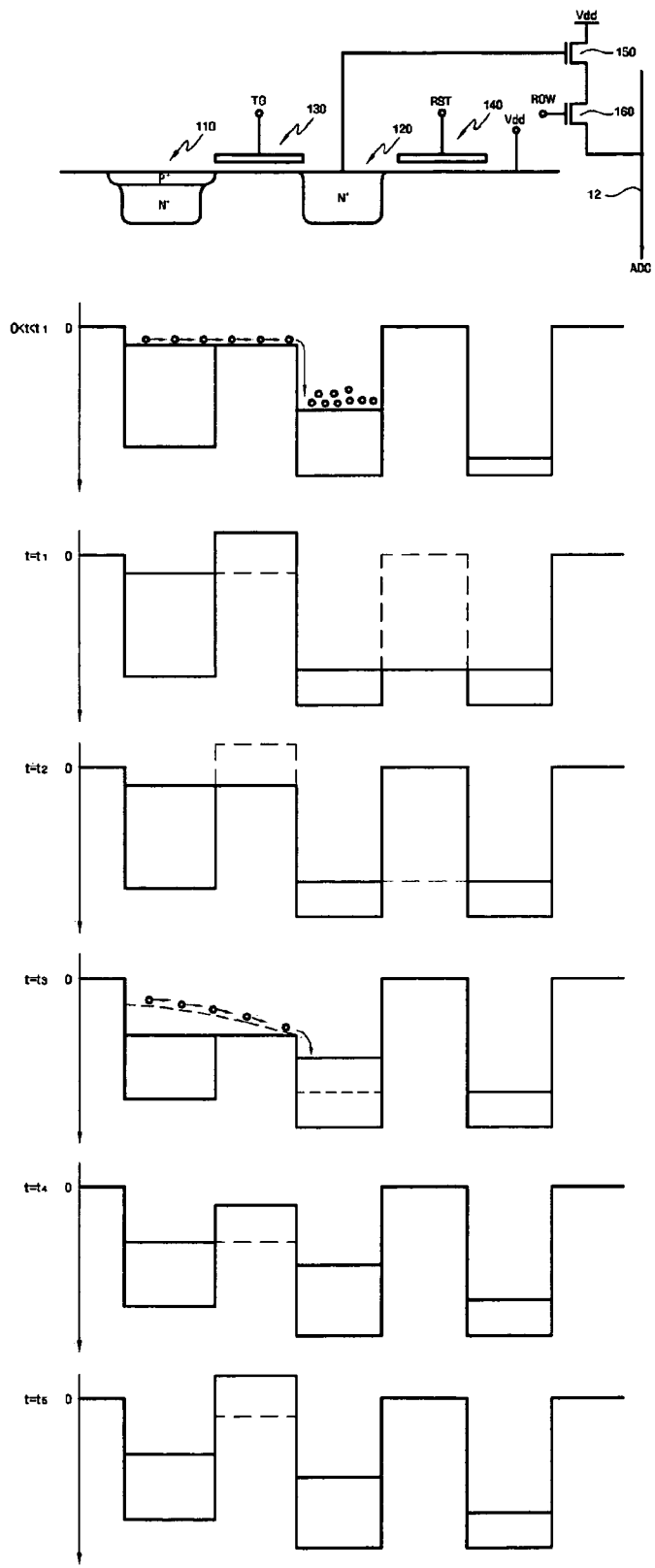
FIG. 9 shows a schematic diagram and a potential diagram of the CMOS image sensor of FIG. 1.

FIG. 8 is a timing diagram of the CMOS image sensor of FIG. 1, and FIG. 9 shows a schematic diagram and a potential diagram of the CMOS image sensor of FIG. 1. In the potential diagram of FIG. 9, the potential before the operation is represented by a dotted line, the potential after the operation is represented by a solid line and the potential increases downwardly.

The operation of the CMOS image sensor 1 using a photodiode as a photoelectric conversion element 110 will now be described with reference to FIGS. 1, 4, 8 and 9. Typically, pixels 100 arranged in the pixel array unit 10 commonly perform charge integration. A reset signal RST and a pixel selection signal ROW are common signals for pixels belonging to each row of the pixel array unit 10. That is, pixels 100 belonging to one row receive a specific reset signal and a specific pixel selection signal.

A pixel array unit is composed of N rows, and the rows are sequentially represented by ROW(1), . . . , ROW(i), ROW(i+1), . . . , ROW(N). For convenience of illustration, the operation of the CMOS image sensor 1 will be described in terms of ROW(i) and ROW(i+1). As described above, a pixel selection signal ROW, a reset signal RST, and a charge transfer signal TG are supplied to the pixel array unit 10 by the row drive unit 20, which is managed by a controller (not shown). The pixel array unit 10 receives these signals, performs charge integration, and transfers the collected charge to charge detection elements. The charge detection elements perform double sampling of the noise level and the signal level.

Referring to FIGS. 8 and 9, the period: $0<t<t_1$ is in a non-selected state. That is, pixel selection signals ROW(i) and ROW(i+1), reset signals RST(i) and RST(i+1), charge transfer signals TG(i) and TG(i+1) are logic "low". However, since a depletion type transistor or an enhancement type transistor with a low threshold voltage (Vth) is used as the charge transfer element 130 to reduce an overflow phenomenon that may be caused in the photoelectric conversion element 110 when excessive light is emitted, even when the charge transfer element 130 is inactivated, a channel is formed. Therefore, generated charge (more than a predetermined amount) can flow into the charge detection element 120 via the charge transfer element 130.

At time $t_1$, when the pixel selection signal ROW(i) transitions to logic "high", the selection element 160 is activated. That is, charge stored in the charge detection element 120 is ready to be read through a vertical signal line 12 connected to a selected pixel 100. At the same time, the reset signal RST(i) transitions to logic "high" and the charge detection element 120 is reset to Vdd. The reset signal RST(i) may transition to logic "high" after the transition of the pixel selection signal ROW(i) to logic "high".

The charge transfer signal TG(i) is converted to a voltage that allows the charge transfer element 130 to have a negative potential. Therefore, holes can be injected into the surface 108 of the semiconductor substrate 102, thus reducing dark current generation. When the photoelectric conversion element 110 is a pinned photodiode, more desirable effects can be obtained.

The voltage that causes the charge transfer element 130 to have a negative potential varies according to the type of charge transfer element 130. That is, this voltage is negative when a depletion type transistor is used as the charge transfer element 130, whereas it is 0 V when an enhancement type transistor with a low threshold voltage is used as the charge transfer element 130.

Preferably, the charge transfer signal TG(i) is supplied to the charge transfer element 130 as the voltage that causes the charge transfer element 130 to have a negative potential, during the period ranging from about 100 ns to 10 μs. The charge transfer signal TG(i) is supplied at least once to the charge transfer element 130 during a charge integration period. Here, the charge integration period indicates all periods except the period for which the charge transfer element 130, when activated, transfers charge to the charge detection element 120.

At time $t_2$, the reset signal RST(i) and the charge transfer signal TG(i) transition to logic "low". Of course, there is no need to simultaneously transition the reset signal RST(i) and the charge transfer signal TG(i). When the reset signal RST(i) is transitioned to logic "low", offset levels, i.e., noise levels, which are different for each pixel, are read through the vertical signal line 12. Although not shown, noise levels of the vertical signal line 12 are held in the correlated double sampler 50 by a sample hold pulse (SHP).

Even when the charge transfer signal TG(i) transitions to logic "low", holes injected into the surface of a semiconductor substrate are held for a predetermined period without being annihilated. Therefore, dark current generation is reduced until the holes are annihilated.

At time $t_3$, the charge transfer signal TG(i) transitions to logic "high" and the charge transfer element 130 is activated. That is, charge collected in the photoelectric conversion element 110 is transferred to the charge detection element 120. At this time, since the charge detection element 120 has parasitic capacitance, charge is cumulatively stored. Therefore, the potential of the charge detection element 120 changes. Here, the period for which the charge transfer element 130 is in an activated state is called a "transfer period."

At time $t_4$, the charge transfer signal TG(i) transitions to logic "low". When the charge transfer signal TG(i) transitions to logic "low", a change in the potential of the charge detection element 120, i.e., a signal level, is read through the vertical signal line 12. Although not shown, the signal level of the vertical signal line 12 is held in the correlated double sampler 50 by a sample hold pulse (SHD).

That is, a noise level and a signal level are subjected to sequential sampling in a pixel 100. Of course, the sampling of the noise level may be preceded by the sampling of the signal level.

According to the above-described operation, output of the noise level and the signal level is controlled by a predetermined switch. Therefore, a fixed noise level is theoretically not generated even when the same channel is used. Furthermore, since a noise level and a signal level are sequentially output, the difference between the noise level and the signal level can be obtained by the correlated double sampler 50, which is a differential circuit, even when a separate memory is not used, simplifying the system.

At time $t_5$, the pixel selection signal ROW(i) transitions to logic "low". The transition of the pixel selection signal ROW(i) to logic "low" may be performed at the same time as the transition of the pixel selection signal ROW(i+1) to logic "high", but is not limited thereto. With a view to reduction in power consumption, it is preferable to adjust the time for the transition of the pixel selection signal ROW(i) to logic "low" so that a signal level can be read through the vertical signal line 12.

At this time, the charge transfer signal TG(i) is converted to a voltage that causes the charge transfer element 130 to have a negative potential. Therefore, holes are injected into the surface 108, thereby reducing dark current generation. Since holes injected at time $t_1$ are annihilated after a predetermined period, the voltage that causes the charge transfer element 130 to have a negative potential is supplied at time $t_5$. The time interval between $t_1$ and $t_5$ is appropriately determined according to a CMOS image sensor used in an experiment. It is preferable that the voltage that causes the charge transfer element 130 to have a negative potential be applied before holes injected at time $t_1$ are annihilated.

Then, several subsequent processes are performed until image display is accomplished by an image signal processing element (not shown). For example, the correlated double sampler 50 outputs the difference between the noise level and the signal level. Therefore, a fixed noise level of the pixel 100 and the vertical signal line 12 is reduced. Further, the analog-to-digital converter 60 receives an analog signal output from the correlated double sampler and outputs a digital signal.

At time $t_6$, the pixel selection signal ROW(i+1) transitions to logic "high". Subsequent operations are the same as in the i-th row. That is, the reset signal RST(i+1) transitions to logic "high" and the charge detection element 120 is reset to Vdd. The charge transfer signal TG(i+1) is converted to a voltage that causes the charge transfer element 130 to have a negative potential, and holes are injected into the surface 108.

At time $t_7$, the charge transfer signal TG(i+1) transitions to logic "high" and charge collected in the photoelectric conversion element 110 is transferred to the charge detection element 120. The charge transfer signal TG(i) is maintained in a logic "low" state without being converted to a voltage that causes the charge transfer element 130 to have a negative potential because a boost control signal BSTX is a common signal for all rows, as described above.

In this regard, when a boost control signal BSTX is set as a common signal for pixels of each row, the charge transfer signal TG(i+1) is driven independently of the charge transfer signal TG(i). That is, the charge transfer signal TG(i+1) is periodically converted to a voltage that causes the charge transfer element 130 to have a negative potential, except for the period for where the charge transfer signal TG(i+1) is logic "high".

Although the foregoing description, for simplicity, has been on a pixel independent read mode in which signals of pixels are independently read, it is not limited to that mode. A frame read mode and field read mode are also possible. In the former mode, signals of odd (or even) lines are read in a first field and signals of even (or odd) lines are read in a second field. In the latter mode, signals of two adjacent lines are read at the same time to add voltages, and combinations of two lines are changed.

Figure 10:
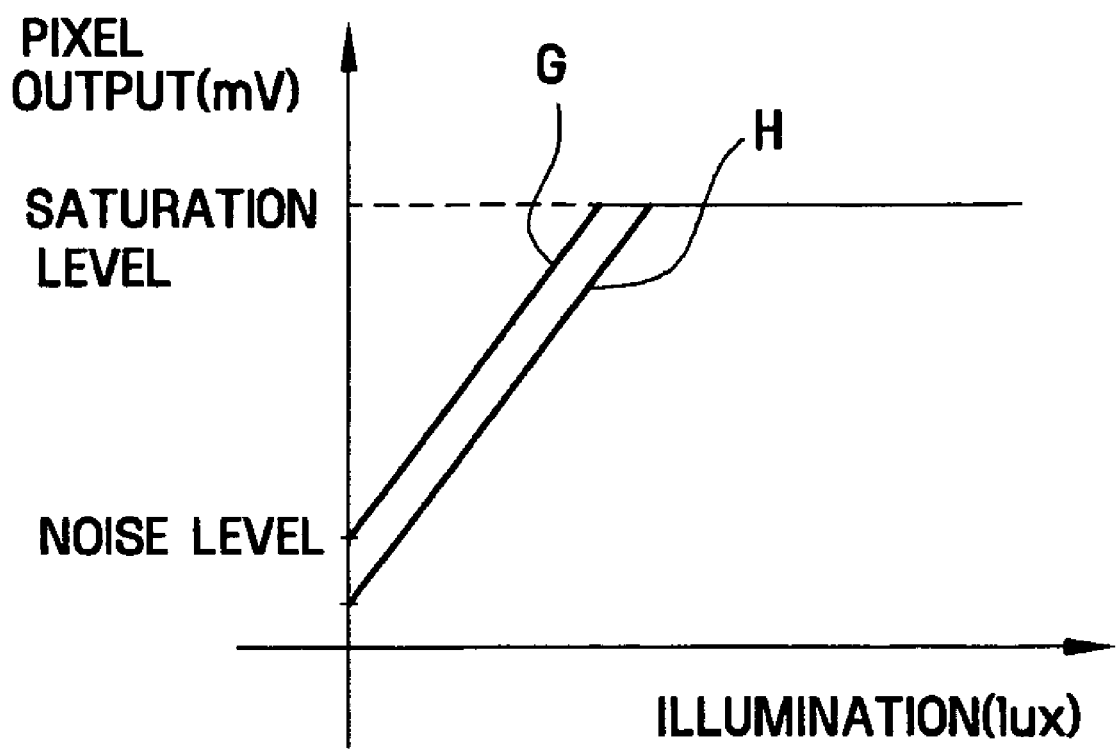
FIG. 10 shows a view illustrating the characteristics of the CMOS image sensor of FIG. 1.

FIG. 10 shows a view illustrating the characteristics of the CMOS image sensor of FIG. 1.

Referring to FIG. 10, a CMOS image sensor 1 according to an embodiment of the present invention exhibits a lower noise level H, as compared to a conventional CMOS image sensor noise level G. The noise is composed of photon shot noise, dark current noise, reset noise, thermal noise, and other noises. Since the CMOS image sensor 1 can reduce dark current generation, the dark current noise level can be reduced.

Furthermore, assuming that a saturation level is constant, such noise reduction can remarkably increase a dynamic range defined as the difference between the saturation level and the noise level.

In addition, since the voltage that causes a charge transfer element to have a negative potential is applied during the charge integration period, dark current is reduced and at the same time overflow and a blooming phenomena can be reduced.

A pixel 100 of the CMOS image sensor 1 may use negative charge as carriers and an NMOS transistor, or it may use positive charges as carriers and a PMOS transistor. The polarity of the voltage can be changed accordingly.

A pixel of the CMOS image sensor according to an embodiment of the present invention may include a signal processing chip and/or a lens system, and it may be a built-in section in an electronic apparatus.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A complementary metal oxide semiconductor (CMOS) image sensor comprising:
   a pixel array unit having a matrix of pixels, wherein each pixel comprises a charge transfer element for transferring charge collected in a photoelectric conversion element to a charge detection element; and
   a row drive unit for supplying a voltage to the charge transfer element during part of a charge integration period of the photoelectric conversion element, wherein the supplied voltage causes the charge transfer element to have a negative potential and including a coupling section negatively boosting a charge transfer processing signal in response to a boost control signal and supplying to the charge transfer element the voltage that causes the charge transfer element to have a negative potential, wherein the voltage is supplied in the range of about 100 ns to 10 μs of the charge integration period.

2. The CMOS image sensor of claim 1, wherein the row drive unit supplies the voltage to the charge transfer element at least once during the charge integration period of the photoelectric conversion element, wherein the supplied voltage causes the charge transfer element to have a negative potential.

3. The CMOS image sensor of claim 1, wherein the charge transfer element is an enhancement type MOS field-effect transistor.

4. The CMOS image sensor of claim 3, wherein the supplied voltage that causes the charge transfer element to have a negative potential is 0 V.

5. The CMOS image sensor of claim 1, wherein the charge transfer element is a depletion type MOS field-effect transistor.

6. The CMOS image sensor of claim 5, wherein the supplied voltage that causes the charge transfer element to have a negative potential is a negative voltage.

7. The CMOS image sensor of claim 1, wherein the supplied voltage tat causes the charge transfer element to have a negative potential is not supplied to the charge transfer element while at least one row of the pixel array unit transfers the charge of the photoelectric conversion element.

8. The CMOS image sensor of claim 1, wherein the row drive unit comprises:
   a drive signal control section supplying a charge transfer processing signal.

9. The CMOS image sensor of claim 8, wherein the boost control signal is a common signal for pixels belonging to a plurality of rows of the pixel array unit.

10. The CMOS image sensor of claim 8, wherein the boost control signal is a common signal for pixels belonging to each row of the pixel array unit.

11. The CMOS image sensor of claim 1, wherein the coupling section is charged by the charge transfer processing signal and comprises a boost capacitor pumping charge in response to the boost control signal.

12. The CMOS image sensor of claim 11, wherein the coupling section further comprises a resistor connected to the boost capacitor and which adjusts a time constant.

13. The CMOS image sensor of claim 1, wherein the photoelectric conversion element is a photodiode, a phototransistor, a photogate, a pinned photodiode, or a combination thereof.

14. The CMOS image sensor of claim 1, wherein each pixel further comprises a selection element for selecting a pixel to be read.

15. The CMOS image sensor of claim 1, wherein each pixel further comprises a reset element for resetting the charge detection element.

16. The CMOS image sensor of claim 1, wherein each pixel further comprises an amplification element for outputting to a vertical signal line a signal corresponding to a potential of the charge detection element.

17. A method of operating a CMOS image sensor, comprising:
   supplying a voltage to a charge transfer element during part of a charge integration period of a photoelectric conversion element, wherein the supplied voltage causes a charge transfer element to have a negative potential and including negatively boosting a charge transfer processing signal in response to a boost control signal and supplying to the charge transfer element the voltage that causes the charge transfer element to have a negative potential; and
   activating the charge transfer element and transferring charge collected in the photoelectric conversion element to a charge detection element, wherein in the step of supplying a voltage to the charge transfer element, the voltage is supplied in about the 100 ns to 10 µs range of the charge integration period.

18. The method of 17, wherein in the step of supplying a voltage to the charge transfer element, the supplied voltage that causes the charge transfer element to have a negative potential is supplied to the charge transfer element at least once during the charge integration period of the photoelectric conversion element.

19. The method of claim 17, wherein the charge transfer element is an enhancement type MOS field-effect transistor.

20. The method of claim 19, wherein the supplied voltage causing the charge transfer element to have a negative potential is 0 V.

21. The method of claim 17, wherein the charge transfer element is a depletion type MOS field-effect transistor.

22. The method of claim 21, wherein the supplied voltage causing the charge transfer element to have a negative potential is a negative voltage.

23. The method of claim 17, further comprising resetting the photoelectric conversion element before transferring the charge collected in the photoelectric conversion element to the charge detection element.

24. The method of claim 17, further comprising outputting a signal corresponding to a potential of the photoelectric conversion element to a vertical signal line, wherein the potential is formed by transferring the charges thereto.

25. The method of claim 17, further comprising holding or sampling a noise level and a signal level of a pixel and outputting a predetermined difference level signal.

26. The method of claim 25, further comprising converting the predetermined difference level signal into a digital signal.

* * * * *